United States Patent
Lee et al.

(10) Patent No.: US 11,740,270 B2
(45) Date of Patent: Aug. 29, 2023

(54) PATTERN GENERATOR AND BUILT-IN-SELF TEST DEVICE INCLUDING THE SAME

(71) Applicant: SAMSUNG ELECTRONICS CO., LTD., Suwon-si (KR)

(72) Inventors: Juyun Lee, Suwon-si (KR); Hanseok Kim, Seoul (KR); Jiyoung Kim, Osan-si (KR); Jaehyun Park, Seoul (KR); Hyeonju Lee, Hwaseong-si (KR); Kangjik Kim, Hwaseong-si (KR); Sunggeun Kim, Hwaseong-si (KR); Seuk Son, Seoul (KR); Hobin Song, Daejeon (KR); Nakwon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/943,551

(22) Filed: Sep. 13, 2022

(65) Prior Publication Data

US 2023/0099986 A1 Mar. 30, 2023

(30) Foreign Application Priority Data

Sep. 13, 2021 (KR) .......................... 10-2021-0122066

(51) Int. Cl.
*G01R 25/04* (2006.01)
*H03L 7/085* (2006.01)
*H03L 7/08* (2006.01)

(52) U.S. Cl.
CPC .............. *G01R 25/04* (2013.01); *H03L 7/085* (2013.01); *H03L 7/0807* (2013.01)

(58) Field of Classification Search
CPC ........ G01R 25/04; H03L 7/0807; H03L 7/085
See application file for complete search history.

(56) References Cited

U.S. PATENT DOCUMENTS

| | | | |
|---|---|---|---|
| 5,793,822 A | 8/1998 | Anderson et al. | |
| 5,963,603 A * | 10/1999 | Li | H04L 7/0054 |
| | | | 375/355 |
| 6,505,222 B1 * | 1/2003 | Davis | H03M 13/00 |
| | | | 375/233 |

(Continued)

FOREIGN PATENT DOCUMENTS

| | | | |
|---|---|---|---|
| KR | 20230039135 A * | 3/2023 | |
| WO | WO-2020206465 A1 * | 10/2020 | ............ H04J 3/0664 |

OTHER PUBLICATIONS

Park, et al., "A built-in self-test circuit for jitter tolerance measurement in high-speed wireline receivers", 2014, IEEE International Test Conference, 7 pages total.

*Primary Examiner* — Adam D Houston
(74) *Attorney, Agent, or Firm* — Sughrue Mion, PLLC

(57) ABSTRACT

An apparatus for generating an output signal having a waveform that is repeated every period, includes a storage configured to store values corresponding to the waveform in a portion of a period of the output signal, a counter configured to generate a first index of a sample included in the output signal, a controller configured to generate at least one control signal based on the first index and the period of the output signal, and a calculation circuit configured to generate the output signal by calculating an output from the storage based on the at least one control signal.

20 Claims, 13 Drawing Sheets

(56) References Cited

U.S. PATENT DOCUMENTS

| | | | |
|---|---|---|---|
| 7,143,323 B2 | 11/2006 | Sweet | |
| 7,158,899 B2 | 1/2007 | Sunter et al. | |
| 7,528,664 B1* | 5/2009 | Liang | H03L 7/085 |
| | | | 341/157 |
| 7,558,991 B2 | 7/2009 | Mattes et al. | |
| 7,665,004 B2 | 2/2010 | Suda et al. | |
| 8,018,258 B2* | 9/2011 | Ma | H03L 7/0891 |
| | | | 327/158 |
| 8,310,383 B2 | 11/2012 | Royle et al. | |
| 8,964,924 B2* | 2/2015 | Calabro | H04L 7/0029 |
| | | | 375/354 |
| 9,065,653 B2 | 6/2015 | Bae et al. | |
| 9,255,966 B2 | 2/2016 | Onodera | |
| 9,423,441 B2 | 8/2016 | Lee et al. | |
| 9,654,117 B1* | 5/2017 | Landheer | H03L 7/0991 |
| 9,680,481 B2* | 6/2017 | Tsunoda | H04L 27/227 |
| 11,070,214 B1* | 7/2021 | Franck | H03L 7/085 |
| 2004/0146132 A1* | 7/2004 | Staszewski | H03L 7/095 |
| | | | 375/376 |
| 2006/0202733 A1* | 9/2006 | Xu | H03L 7/16 |
| | | | 327/291 |
| 2011/0012659 A1* | 1/2011 | Utamaru | H03L 7/081 |
| | | | 327/156 |
| 2011/0148481 A1* | 6/2011 | Chung | H03K 4/501 |
| | | | 327/100 |
| 2011/0299583 A1* | 12/2011 | Yamaguchi | H04B 3/12 |
| | | | 375/232 |
| 2011/0299585 A1* | 12/2011 | Tomita | H04L 25/03057 |
| | | | 375/236 |
| 2014/0159788 A1* | 6/2014 | Chen | H03L 7/085 |
| | | | 327/156 |
| 2015/0139364 A1* | 5/2015 | Song | G11C 7/1063 |
| | | | 375/340 |
| 2015/0229314 A1* | 8/2015 | Hata | H03L 7/0807 |
| | | | 327/199 |
| 2016/0142061 A1* | 5/2016 | Hung | H03K 5/01 |
| | | | 327/295 |
| 2016/0164558 A1* | 6/2016 | Elzeftawi | H03L 7/099 |
| | | | 455/192.1 |
| 2017/0285138 A1* | 10/2017 | Park | G01S 13/10 |
| 2018/0302214 A1* | 10/2018 | Terlemez | H03L 7/0807 |
| 2019/0044693 A1* | 2/2019 | He | H04L 7/0332 |
| 2019/0068204 A1* | 2/2019 | Yamaguchi | H03L 7/087 |
| 2019/0173516 A1* | 6/2019 | Lan | H03L 7/07 |
| 2019/0297589 A1* | 9/2019 | Boehlke | H04R 27/00 |
| 2020/0106447 A1* | 4/2020 | Monk | H03L 7/093 |
| 2022/0209930 A1* | 6/2022 | Kim | H04L 7/0004 |
| 2023/0085155 A1* | 3/2023 | Malone | G06F 1/08 |
| 2023/0099986 A1* | 3/2023 | Lee | H03L 7/0807 |
| | | | 327/156 |

* cited by examiner

PATTERN GENERATOR AND BUILT-IN-SELF TEST DEVICE INCLUDING THE SAME

CROSS-REFERENCE TO RELATED APPLICATION

This application is based on and claims priority under 35 U.S.C. § 119 to Korean Patent Application No. 10-2021-0122066, filed on Sep. 13, 2021, in the Korean Intellectual Property Office, the disclosure of which is incorporated by reference herein in its entirety.

BACKGROUND

1. Field

The disclosure relates to a pattern generator, and more particularly, to a pattern generator for generating a signal having a waveform that is repeated every period, and a built-in self-test device including the same

2. Description of Related Art

A built-in self-test may refer to a self-test without a separate test device, and a pattern generator for generating a test pattern may be required in the built-in self-test. A jitter tolerance (JTOL) test may be used to verify a jitter level at which a receiver may operate without error. The JTOL test may require generation of a jitter signal having a waveform that is repeated every period, and it may be required to efficiently generate a jitter signal to verify the JTOL through the built-in self-test.

SUMMARY

Provided is a device for generating a signal having a waveform that is repeated every period with high efficiency.

Additional aspects will be set forth in part in the description which follows and, in part, will be apparent from the description, or may be learned by practice of the presented embodiments.

According to an aspect of an example embodiment of the disclosure, an apparatus for generating an output signal having a waveform that is repeated every period, may include a storage configured to store values corresponding to the waveform in a portion of a period of the output signal, a counter configured to generate a first index of a sample included in the output signal, a controller configured to generate at least one control signal based on the first index and the period of the output signal, and a calculation circuit configured to generate the output signal by calculating an output from the storage based on the at least one control signal.

According to an aspect of an example embodiment of the disclosure, an apparatus may include a clock recovery circuit configured to, based on an input signal and a reference clock signal, generate an output clock signal synchronized with the input signal, and a jitter code generating circuit configured to provide, to the clock recovery circuit, a jitter code signal having a waveform that is repeated every period. The jitter code generating circuit may include a storage configured to store values corresponding to the waveform in a portion of a period, a calculation circuit configured to generate the jitter code signal by calculating an output from the storage, and a controller configured to control the storage and the calculation circuit.

According to an aspect of an example embodiment of the disclosure, a method of generating an output signal having a waveform that is repeated every period may include generating a first index of a sample included in the output signal, generating at least one control signal based on the first index and a period of the output signal, acquiring a value corresponding to the waveform in a portion of the period from a storage based on the at least one control signal, and generating the output signal based on the acquired value.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, various embodiments of the inventive concept are described with reference to the accompanying drawings. The embodiments described herein are example embodiments, and thus, the inventive concept is not limited thereto and may be realized in various other forms. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. In the present specification, the pattern signal may refer to a signal having a waveform that is periodically repeated.

Figure 1:
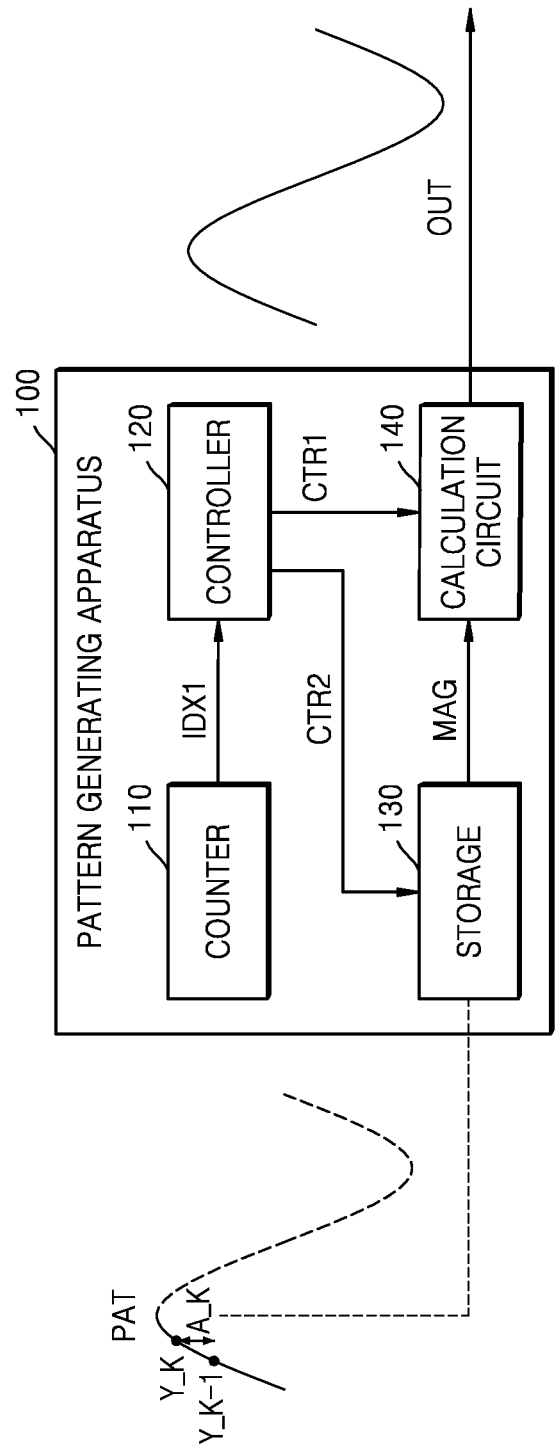
FIG. 1 is a diagram of a pattern generating apparatus according to an embodiment.

FIG. 1 is a diagram of a pattern generating apparatus 100 according to an embodiment. The pattern generating apparatus 100 may be referred to as a pattern generator. The pattern generating apparatus 100 may generate an output signal OUT having a waveform that is repeated every period. The output signal OUT may have various waveforms, such as a sine wave, a square wave, and a triangle wave, having characteristics that are repeated every period. The output signal OUT may be used as an input signal of other electronic devices. The pattern generating apparatus 100 may operate to generate the output signal OUT having a waveform similar to that of a pattern signal PAT. The pattern generating apparatus 100 may refer to a certain electronic device that generates the output signal OUT by calculating values corresponding to the pattern signal PAT. As illustrated in FIG. 1, the pattern generating apparatus 100 may include a counter 110, a controller 120, a storage 130, and a calculation circuit 140.

The counter 110 may generate a first index IDX1 indicating indexes of samples of the output signal OUT.

The storage 130 may store values corresponding to the pattern signal PAT, and when the pattern signal PAT has a repeating waveform even within one period, the storage 130 may store some of values corresponding to the pattern signal PAT. As is described below, the values corresponding to the remaining portion of the pattern signal PAT, that is not stored, may be generated by changing the order in which values stored in the storage 130 are output or changing signs of outputs of the storage 130 in the calculation circuit 140. In some embodiments, as is described below with reference to FIG. 3, the storage 130 may store values corresponding to the pattern signal PAT. For example, the storage 130 may store a magnitude A_K of an increment value between pattern signal PAT samples (Y_K, where K is an integer of 0 or greater) arranged at unit time intervals.

The controller 120 may receive a first index IDX1 from the counter 110, and generate first and second control signals CTR1 and CTR2 based on the first index IDX1 and a period of the output signal OUT. The control signal may be the first control signal CTR1 and the second control signal CTR2. The first control signal CTR1 may be a set of signals for controlling the calculation circuit 140, and the second control signal CTR2 may be a set of signals for controlling the storage 130. The second control signal CTR2 may control to output values stored in the storage 130, and the first control signal CTR1 may determine which operation the calculation circuit 140 is to perform. The storage 130 may output a signal indicating a value corresponding to the pattern signal PAT based on the second control signal CTR2. The calculation circuit 140 may generate the output signal OUT by calculating an output from the storage 130 based on the first control signal CTR1.

The counter 110 may generate the first index IDX1 at regular time intervals. For example, the first index IDX1 may be a signal sequentially increasing by 1 at a time from 0 to 1024. When the output signal OUT appears for 1.024 seconds, the first index IDX1 may mean an index of each of output signal OUT samples listed at a unit time interval of 0.001 seconds from 0 to 1.023 seconds in the output signal OUT. The controller 120 may receive the first index IDX1 from the counter 110, identify the indexes of the samples, and generate the first and second control signals CTR1 and CTR2. After increasing up to 1024, the first index IDX1 may increase again, starting from 0, to 1024 by 1 at a time, and the pattern generating apparatus 100 may repeat the above process of generating the output signal OUT to generate the output signal OUT having a waveform that is repeated periodically.

The pattern generating apparatus 100 may adjust the period of the output signal OUT using the controller 120. The controller 120 may receive the first index IDX1 from the counter 110 and determine a second index IDX2 corresponding to the period of the output signal OUT. The second index IDX2 may correspond to the period of the output signal OUT by indicating a time axis index difference between a sample that is a start point of one period of the output signal OUT and a sample that is an end point of one period of the output signal OUT. The controller 120 may identify a waveform of the output signal OUT corresponding to the first index IDX1 and the second index IDX2 and may generate control signals corresponding to the waveform of the output signal OUT. For example, the output signal OUT may appear for 1.024 seconds, and a period thereof may be 0.512 seconds. When the first index IDX1 sequentially increases from 0 to 1024, the first index IDX1 may refer to a time axis index of each of the samples listed at intervals of 0.001 seconds from 0 seconds to 1.024 seconds in the output signal OUT. The controller 120 may determine the second index IDX2 to be 512 in order to set the period of the output signal OUT to 0.512 seconds. When the controller 120 wants to change the control signal at every ¼ period of the output signal OUT, the controller 120 may the control signal when the first index IDX1 received from the counter 110 is 128, 256, 384, 512, 640, 768, 896, and 1024, which are a ¼ multiple of the second index, thereby changing the control signal at every ¼ period of the output signal OUT.

Upon receiving the first index IDX1 from the counter 110, the controller 120 may identify time axis indexes of the output signal OUT samples and determine the second index IDX2 corresponding to the period of the output signal OUT. Based on the first index IDX1 and the second index IDX2, the controller 120 may identify time axis indexes of the output signal OUT samples and the order of the output signal OUT samples within one period. The controller 120 may generate the first and second control signals CTR1 and CTR2 based on the identified sample. The storage 130 may output a magnitude signal MAG corresponding to the sample based on the second control signal CTR2 received from the controller 120. The calculation circuit 140 may calculate the magnitude signal MAG received from the storage 130 based on the first control signal CTR1 received from the controller 120 and generate the output signal OUT.

The controller 120 may generate a sign control signal corresponding to a sign of the magnitude signal MAG output from the storage 130, and the first control signal CTR1 may include the sign control signal. For example, when a sign corresponding to the magnitude signal MAG is negative, the controller 120 may generate a sign control signal having a high logic level to control the calculation circuit 140 to calculate a value obtained by multiplying the magnitude signal MAG output from the storage 130 by −1. When a sign corresponding to the magnitude signal MAG is a positive number, the controller 120 may generate a sign control signal having a low logic level to control the calculation circuit 140 to generate the magnitude signal MAG output from the storage 130.

When the pattern signal PAT has a waveform that is repeated even within one period, the pattern generating apparatus 100 may generate the output signal OUT by storing a value corresponding to the pattern signal PAT to be less than one period in the storage. For example, when the pattern signal PAT is a signal in which mutually symmetric shapes are repeated at every 90 degrees like a sine wave, the storage 130 may store values corresponding to 0 degrees to 90 degrees of the pattern signal PAT. Values corresponding to 90 degrees to 180 degrees of the pattern signal PAT may be generated by a method such as changing the order of outputting values stored in the storage 130 or changing signs of outputs from the storage 130 in the calculation circuit 140. When the pattern signal PAT is a signal having a shape that is inverted at every 180 degrees (e.g., similar to a sine wave), the controller 120 may generate a first control signal CTR1 corresponding to a phase of 0 degrees to 180 degrees of the output signal OUT and transfer the generated first control signal CTR1 to the calculation circuit 140. The calculation circuit 140 may generate the output signal OUT corresponding to the phase of 0 degrees to 180 degrees by calculating the magnitude signal MAG received from the storage 130 based on the first control signal CTR1 received from the controller 120.

Thereafter, in order to generate the output signal OUT corresponding to a phase of 180 degree to 360 degree, the controller 120 may control the circulation circuit 140 with a signal opposite to the first control signal CTR1, which was used to generate the output signal OUT corresponding to the phase of 0 degrees to 180 degrees, such that the calculation circuit 140 may calculate the magnitude signal MAG inversely. Through this, the pattern generating apparatus 100 may generate the output signal OUT corresponding to the phase of 180 degrees to 360 degrees.

In some embodiments, the storage 130 may store the magnitude A_K of an increment value between pattern signal PAT samples (Y_K, where K is an integer of 0 or greater) listed at unit time intervals, and the pattern signal PAT may have an inverted shape at every 180-degree phase. The storage 130 may store values corresponding to phase of 0 degrees to 180 degrees of the pattern signal PAT. The storage 130 may store the magnitude A_K of the increment of the pattern signal PAT per unit period during a period corresponding to half the period of the pattern signal PAT. The storage 130 may output the magnitude signal MAG indicating the magnitude A_K of the increment value of the pattern signal PAT based on the second control signal CTR2 received from the controller 120.

The calculation circuit 140 may perform an operation of receiving the magnitude signal MAG from the storage 130 and accumulating the magnitude signal MAG or a value obtained by multiplying the magnitude signal MAG by −1 based on the first control signal CTR1 received from the controller 120. In some embodiments, the calculation circuit 140 may generate an output signal OUT having a phase of 0 degrees to 180 degrees as a result of the calculation. In addition, the calculation circuit 140 May generate values corresponding to the phase of 180 degrees to 360 degrees of the pattern signal PAT which are not stored in the storage 130 using a characteristic in which the pattern signal PAT is inverted at every 180-degree phase. That is, the calculation circuit 140 may reversely accumulate the magnitude signal MAG or the value obtained by multiplying the magnitude signal MAG by −1 based on the first control signal CTR1, and generate the output signal OUT corresponding to the phase of 180 degrees to 360 degrees of the pattern signal PAT.

Figure 2:
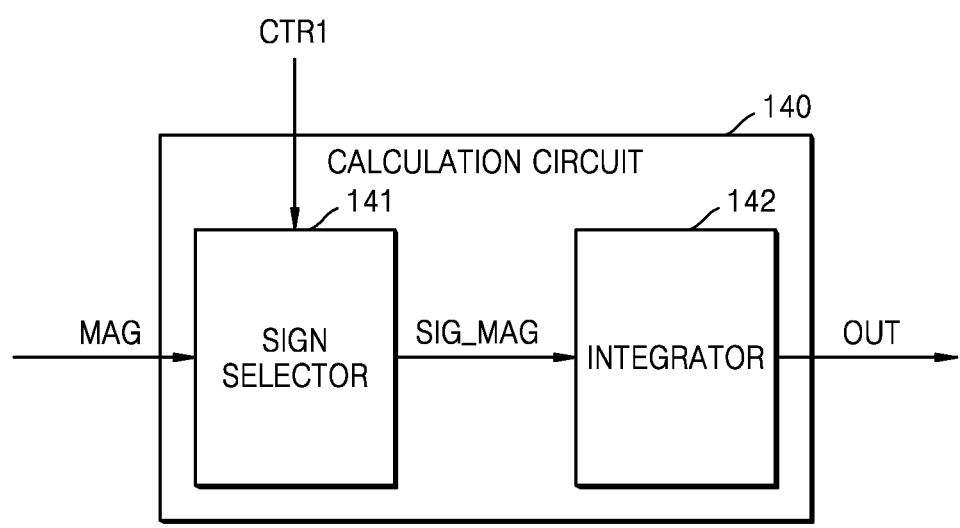
FIG. 2 is a diagram illustrating a calculation circuit of FIG. 1, according to an embodiment.

FIG. 2 is a diagram illustrating the calculation circuit 140 of FIG. 1 according to an embodiment. The calculation circuit 140 may include a sign selector 141 and an integrator 142. The sign selector 141 may receive the first control signal CTR1 from the controller 120 and receive the magnitude signal MAG from the storage 130. When the first control signal CTR1 has a high logic level, the sign selector 141 may multiply the magnitude signal MAG by −1 to generate a variation signal SIG_MAG having a negative value. When the first control signal CTR1 has a low logic level, the sign selector 141 may generate a variation signal SIG_MAG having the same value as that of the magnitude signal MAG having a positive value. The integrator 142 may generate the output signal OUT by accumulating the variation signal SIG_MAG received from the sign selector 141.

Figure 3:
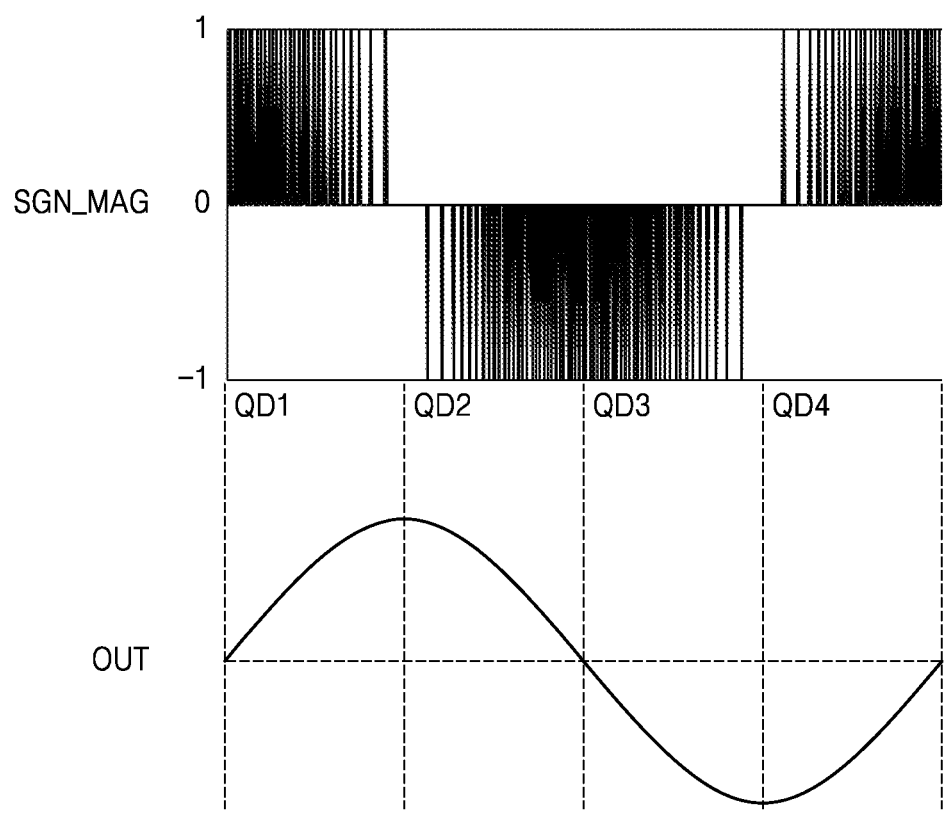
FIG. 3 is a diagram illustrating an example of a variation signal (or a change amount signal) and an output signal, according to an embodiment.

FIG. 3 is a diagram illustrating an example of a variation signal and an output signal according to an embodiment. Hereinafter, FIG. 3 is described with reference to FIG. 2. In FIG. 3, the output signal appears on first to fourth quadrants QD1 to QD4. FIG. 3 illustrates a case in which the magnitude of the variation signal SIG_MAG is 1 when the variation signal SIG_MAG is positive or negative, but the magnitude of the variation signal SIG_MAG is not limited thereto and may appear in various sizes. When the magnitude signal MAG has a value of 0, the variation signal SIG_MAG, which is an output from the sign selector 141, also has a value of 0, and thus, the integrator 142 may generate an output signal OUT having the same value as that of the accumulated value from a previous variation signal SIG_MAG. When the sign control signal has a low logic level and the variation signal SIG_MAG, which is an output of the sign selector 141, is positive, the integrator 142 may generate an output signal OUT obtained by adding the positive value to the value accumulated from the previous variation signal SIG_MAG. Accordingly, a result of accumulating the variation signal SIG_MAG having a value of 0 or 1 appears as the first quadrant QD1 and the fourth quadrant QD4 of the output signal OUT.

When the sign control signal CTR1 has a high logic level and the variation signal SIG_MAG output from the sign selector 141 is negative, the integrator 142 may generate an output signal OUT obtained by adding the negative value to the value accumulated from the previous variation signal SIG_MAG. Accordingly, a result of accumulating the variation signal SIG_MAG having a value of 0 or −1 appears as the second quadrant QD2 and the third quadrant QD3 of the output signal OUT.

Figure 4:
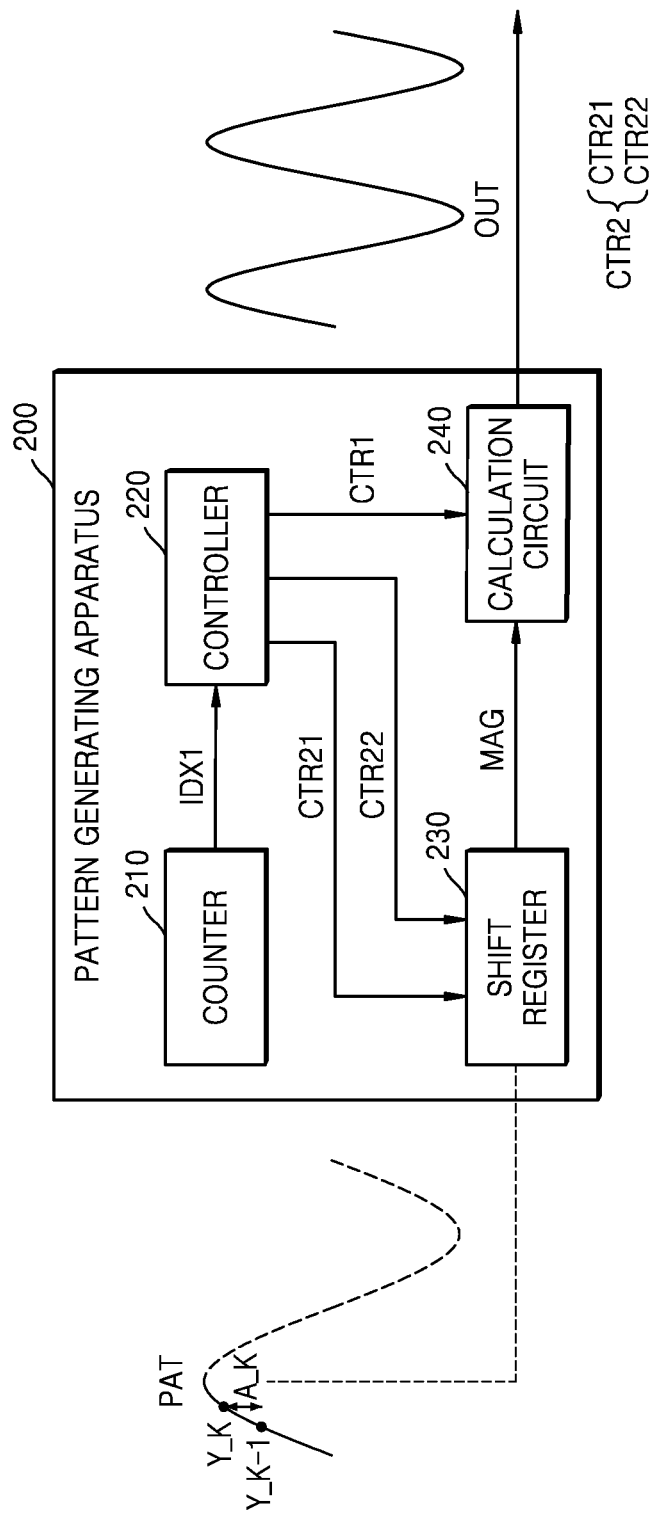
FIG. 4 is a diagram illustrating a pattern generating apparatus according to an embodiment.

FIG. 4 is a diagram illustrating a pattern generating apparatus 200 according to an embodiment. The pattern generating apparatus 200 of FIG. 4 may include a shift register 230 as the storage 130 of the pattern generating apparatus 100 of FIG. 1. As shown in FIG. 4, the pattern generating apparatus 200 may include a counter 210, a controller 220, the shift register 230, and a calculation circuit 240.

As described above with reference to FIG. 1, the controller 220 may receive the first index IDX1 from the counter 210 and determine the second index IDX2 corresponding to the period of the output signal OUT to generate the second control signal CTR2 corresponding to a sample of the output signal OUT. The second control signal CTR2 may include a direction control signal CTR21 for determining a shift direction of the shift register 230 and a shift control signal CTR22 for determining a shift amount of the shift register 230. The shift register 230 may store the magnitude A_K of the increment value of the pattern signal PAT per unit time, and output the magnitude signal MAG representing the magnitude A_K of the increment value of the pattern signal PAT per unit time. The shift register 230 may output values stored in an order corresponding to the direction control signal CTR21, as the magnitude signal MAG. For example, when the direction control signal CTR21 has a low logic level, the shift register 230 may output the value stored in the shift register 230 in a first direction, and when the direction control signal CTR21 has a high logic level, the shift register 230 may output the value stored in the shift register 230 in a second direction. The first direction may correspond to left to right, and the second direction may correspond to right to left.

The shift register 230 may store the magnitude A_K of the increment value per unit time of the pattern signal PAT as 1 bit. For example, when the magnitude A_K of the increment value of the pattern signal PAT per unit time has a value between 0 and 1, the shift register 230 may store the value as 0 or 1 by rounding off from the first decimal place.

When the shift register 230 outputs the magnitude signal MAG, the shift control signal CTR22 may determine how much to shift and output. For example, the shift register 230 may store '10101100' by storing the increment value A_K as 1 bit, while the unit time of the pattern signal PAT passes eight times. When the direction control signal CTR21 has a low logic level and the shift control signal CTR22 has a value of 1, the shift register 230 may output '10101100' as a magnitude signal MAG for 8 unit times by shifting by 1, each time, from the left of the value stored in the shift register 23, when outputting the magnitude signal MAG. When the direction control signal CTR21 has a low logic level and the shift control signal CTR22 has a value of 2, the shift register 230 may output '1110' as a magnitude signal MAG for 4 unit times by shifting by 2, each time, from the left. As a result, the controller 220 may adjust the shift amount of the magnitude signal MAG by adjusting the value of the shift control signal CTR22.

When the pattern signal PAT has a waveform that is repeated even within one period like a sine wave, the shift register 230 may store some of the magnitudes A_K of the increment value of the pattern signal PAT per unit time. The magnitudes A_K of the remaining increment values per unit time of the pattern signal PAT, that are not stored, may be generated by inverting the shift direction of the shift register 230 or by reversely calculating an output sign of the shift register 230 in the calculation circuit 240. The calculation circuit 240 may perform an operation of accumulating the magnitude signal MAG output from the shift register 230 or the value obtained by multiplying the magnitude signal MAG by −1 as it is based on the first control signal CTR1.

Figure 5:
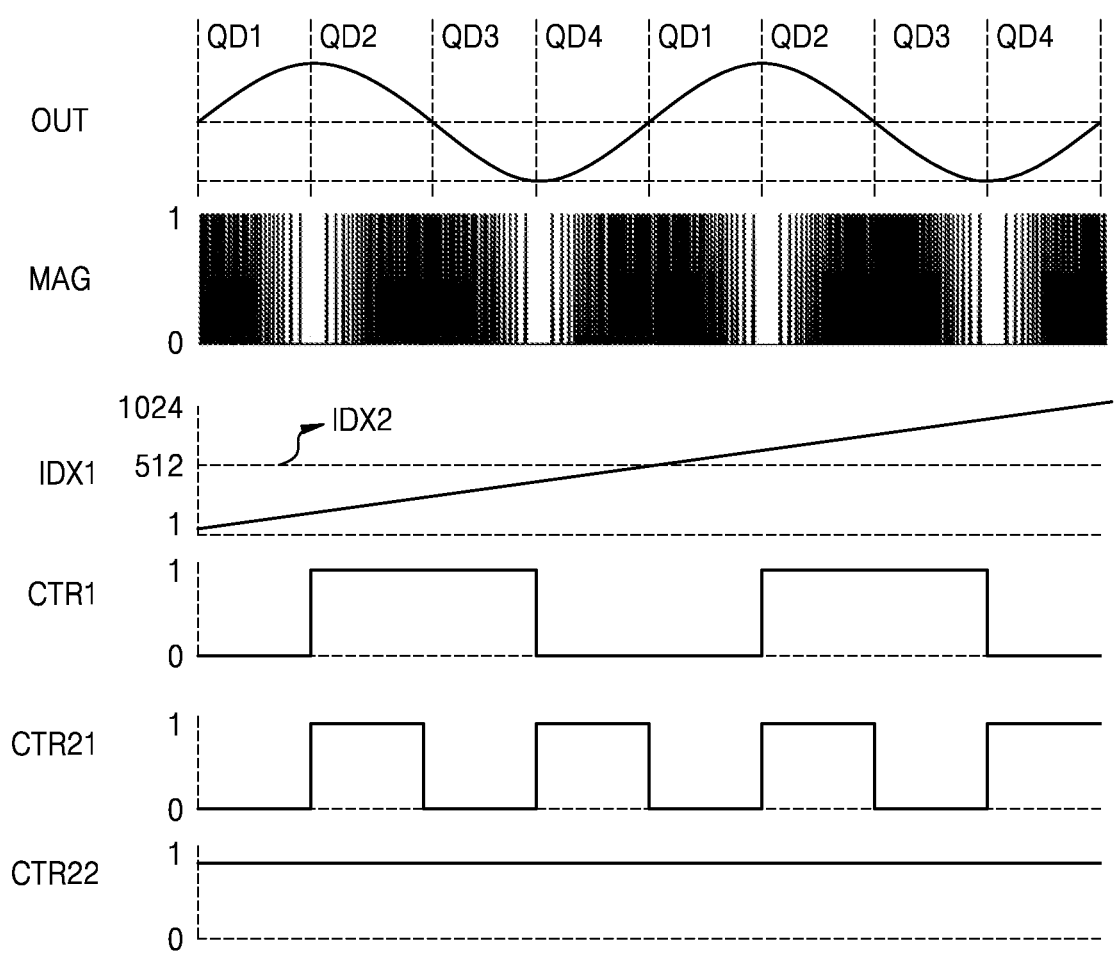
FIG. 5 is a diagram illustrating an example of the signals of FIG. 4, according to an embodiment.

FIG. 5 is a diagram illustrating an example of the signals of FIG. 4 according to an embodiment. Hereinafter, FIG. 5 is described with reference to FIG. 4. When the pattern signal PAT is a signal having a waveform that is repeated at every 90 degrees (e.g., similar to a sine wave), the shift register 230 may store values corresponding to the phase of 0 degrees to 90 degrees, which is a quarter phase of the period of the pattern signal PAT and output the magnitude signal MAG. The first index IDX1 may sequentially increase by 1 from 0 to 1024, and may refer to a time axis index of samples of the output signal OUT. The second index IDX2 may refer to a period of the output signal OUT. The first control signal CTR1 may be a signal for controlling the sign of the magnitude signal MAG output from the shift register 230. The controller 220 may generate the first control signal CTR1 having a value of 1 and control the calculation circuit 240 to perform an operation of accumulating a value obtained by multiplying the magnitude signal MAG output from the shift register 230 by −1. In addition, the controller 220 may generate the first control signal CTR1 having a value of 0 and control the calculation circuit 240 to perform an operation of accumulating the magnitude signal MAG output from the shift register 230 as it is. As shown in FIG. 5, the controller 220 may change the control signals CTR1, CTR21, and CTR22 at every ¼ period of the output signal OUT based on the first index IDX1 and the second index IDX2. The first control signal CTR1 may have a value of 1 for a time corresponding to the second quadrant QD2 and the third quadrant QD3 of the output signal OUT, and may have a value of 0 for a time corresponding to the first quadrant QD1 and the fourth quadrant QD4.

The direction control signal CTR21 may be a signal for controlling the shift direction of the shift register 230. The controller 220 may generate the direction control signal CTR21 having a value of 0 and control the shift register 230 to output the magnitude signal MAG in the first direction. In addition, the controller 220 may generate the direction control signal CTR21 having a value of 1 and control the shift register 230 to output the magnitude signal MAG in a second direction opposite to the first direction. As shown in FIG. 5, the direction control signal CTR21 may have a value of 1 for a time corresponding to the second quadrant QD2 and the fourth quadrant QD4 of the output signal OUT, and may have a value of 0 for a time corresponding to the first quadrant QD1 and the third quadrant QD3. The shift register 230 may output the magnitude signal MAG by changing the shift direction at every 90-degree phase of the output signal OUT as shown in FIG. 5 based on the direction control signal CTR21. The calculation circuit 240 may receive the magnitude signal MAG and generate the output signal OUT as shown in FIG. 5 by calculating the magnitude signal MAG based on the first control signal CTR1.

The shift control signal CTR22 may be a signal for controlling a shift amount of the shift register 230. The controller 220 may generate the shift control signal CTR22 having a value of 1 and control the shift register 230 to output, while shifting by 1 each time. As shown in FIG. 5, the shift control signal CTR22 may have a value of 1 for a time corresponding to the first to fourth quadrants QD1 to QD4 of the output signal OUT.

Figure 6:
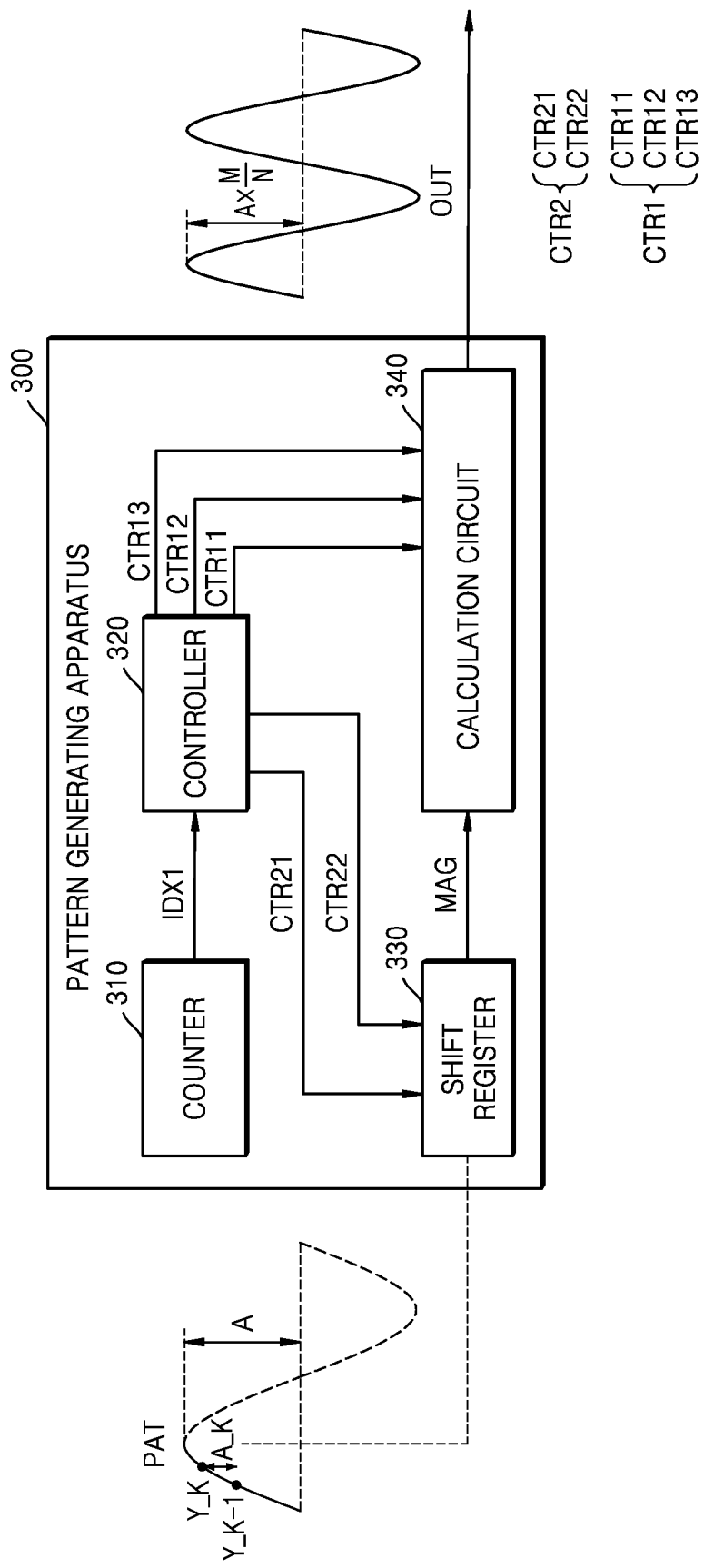
FIG. 6 is a diagram of a pattern generating apparatus according to an embodiment.

FIG. 6 is a diagram of a pattern generating apparatus 300 according to an embodiment. As shown in FIG. 6, the pattern generating apparatus 300 may include a counter 310, a controller 320, a shift register 330, and a calculation circuit 340. The controller 320 may provide a first control signal CTR1 to the calculation circuit 340, and the first control signal CTR1 may include a sign control signal CTR11, a gain amplification signal CTR12, and a gain attenuation signal CTR13. The pattern generating apparatus 300 may include a calculation circuit 340 capable of adjusting a gain of the output signal OUT based on the control signals CTR11, CTR12, and CTR13 received from the controller 320. As described above with reference to FIG. 4, the controller 320 may receive the first index IDX1 from the counter 310 and determine the second index IDX2 corresponding to the period of the output signal OUT to generate the second control signal CTR2 corresponding to a sample of the output signal OUT. The second control signal CTR2 may include a direction control signal CTR21 for determining a shift direction of the shift register 330 and a shift control signal CTR22 for determining a shift amount of the shift register 330. The shift register 330 may store the magnitude A_K of the increment value of the pattern signal PAT per unit time, and output the magnitude signal MAG representing the magnitude A_K of the increment value of the pattern signal PAT per unit time.

The controller 320 may generate a gain amplification signal CTR12 for amplifying a gain of the output signal OUT and a gain attenuation signal CTR13 for attenuating the gain of the output signal OUT, as is described below with reference to FIG. 7 and the like. For example, when the gain amplification signal CTR12 has a value corresponding to M, the calculation circuit 340 may amplify a gain of the output signal OUT by M times (M is a real number greater than 1), and when the gain attenuation signal CTR13 has a value corresponding to N, the calculation circuit 340 may attenuate the gain of the output signal OUT by N times (N is a real number greater than 1). As a result, the calculation circuit 340 may receive the gain amplification signal CTR12 having the value M and the gain attenuation signal CTR13 having the value N, and may amplify the gain of the output signal OUT by M/N times.

Figure 7:
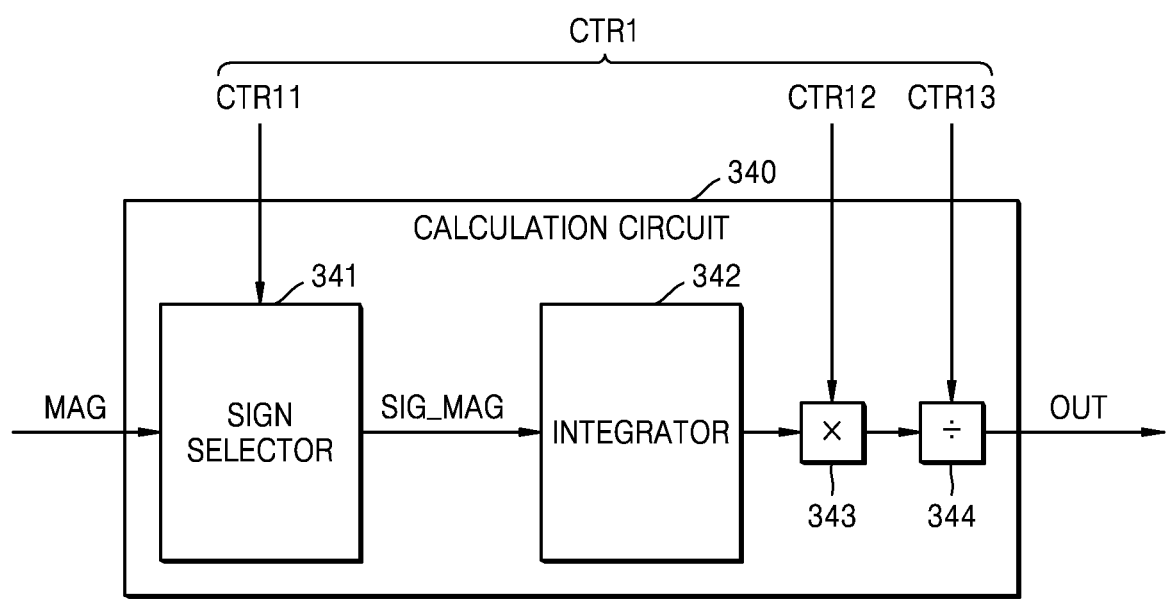
FIG. 7 is a diagram illustrating a calculation circuit of FIG. 6, according to an embodiment.

FIG. 7 is a diagram illustrating the calculation circuit 340 of FIG. 6 according to an embodiment. Hereinafter, FIG. 7 is described with reference to FIG. 6. As shown in FIG. 7, the calculation circuit 340 may include a sign selector 341, an integrator 342, a gain amplifier 343, and a gain attenuator 344. The first control signal CTR1 may include a sign control signal CTR11, a gain amplification signal CTR12, and a gain attenuation signal CTR13.

The sign selector 341 may receive the sign control signal CTR11 from the controller 320 and receive the magnitude signal MAG from the shift register 330. When the sign control signal CTR11 has a high logic level, the sign selector 341 may multiply the magnitude signal MAG by −1 to generate the variation signal SIG_MAG having a negative value. When the sign control signal CTR11 has a low logic level, the sign selector 341 may generate the variation signal SIG_MAG having the same value as that of the magnitude signal MAG having a positive value.

The integrator 342 may output a signal obtained by accumulating the variation signal SIG_MAG received from the sign selector 341. The gain amplifier 343 may receive an output from the integrator 342, multiply the output by a value corresponding to the gain amplification signal CTR12, and output a resultant value. The gain attenuator 344 may receive an output of the gain amplifier 343 and divide a value corresponding to the gain attenuation signal CTR13 to generate the output signal OUT. However, either the gain amplifier 343 or the gain attenuator 344 may be omitted depending on the design or process of the calculation circuit 140.

Figure 8:
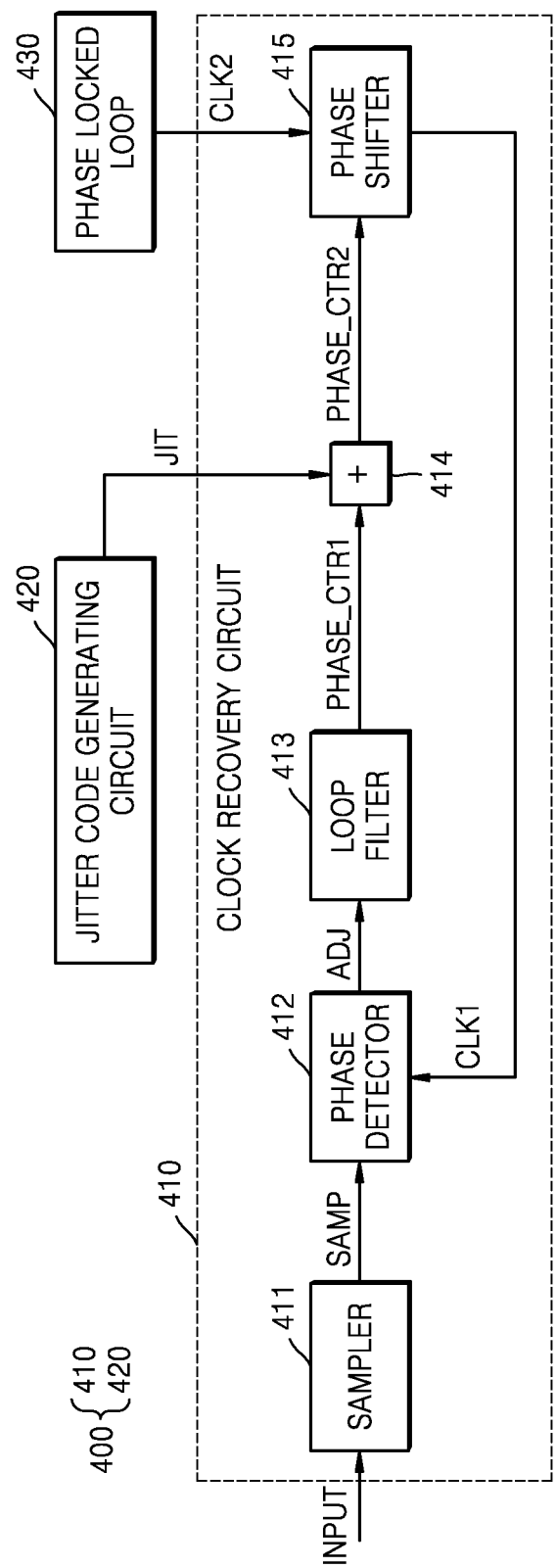
FIG. 8 is a diagram of a clock recovery apparatus according to an embodiment.

FIG. 8 is a diagram of a clock recovery apparatus 400 according to an embodiment. As shown in FIG. 8, the clock recovery apparatus 400 may include a clock recovery circuit 410 and a jitter code generating circuit 420.

The clock recovery circuit 410 may include a sampler 411, a phase detector 412, a loop filter 413, an adder 414, and a phase shifter 415. The sampler 411 may sample an input signal to generate a sampling signal SAMP. The phase detector 412 may receive the sampling signal SAMP and the first clock signal CLK1 from the phase shifter 415, and generate an adjustment signal ADJ by detecting a phase difference between the sampling signal SAMP and the first clock signal CLK1. The loop filter 413 may receive the adjustment signal ADJ and generate a first phase control signal PHASE_CTR1 such that the phase shifter 415 may cancel out the phase difference. The adder 414 may add a jitter code signal received from the jitter code generating circuit 420 to the first phase control signal PHASE_CTR1 received from the loop filter 413 to generate a second phase control signal PHASE_CTR2. The phase shifter 415 may generate the clock signal CLK1 obtained by shifting a phase of the second clock signal CLK2 received from a phase-locked loop (PLL) 430 based on the second phase control signal PHASE_CTR2.

The jitter code generating circuit 420 may be the pattern generating apparatus described above with reference to the drawings. For example, the jitter code generating circuit 420 may be the pattern generating apparatus 100 of FIG. 1, and may include the storage 130, the calculation circuit 140, and the controller 120. The jitter code generating circuit 420 may operate to generate a jitter code signal JIT corresponding to a waveform that is periodically. The storage 130 of the jitter code generating circuit 420 may store values corresponding to the pattern signal PAT, and when the pattern signal PAT has a waveform repeated even within one period, the storage 130 may store some of values corresponding to the pattern signal PAT. Values corresponding to the remaining portion of the pattern signal PAT, that are not stored, may be generated by a method such as changing the output order of the values stored in the storage 130 or changing the output sign of the storage 130 in the calculation circuit 140. The controller 120 may generate a plurality of control signals for controlling the storage 130 and the calculation circuit 140. The storage 130 may output a signal indicating a value corresponding to the pattern signal PAT based on the control signal, and the calculation circuit 140 may generate the jitter code signal JIT by calculating an output from the storage 130 based on a control signal.

The controller 120 may generate a sign control signal (e.g., CTR11 of FIG. 6) for controlling the calculation circuit 140 to identify an output sign of the storage 130. For example, when the output sign of the storage 130 is negative, the controller 120 may generate the sign control signal CTR11 having a high logic level, and control the calculation circuit 140 to perform an operation of accumulating a value obtained by multiplying the output from the storage 130 by −1. When the output sign of the storage 130 is positive, the controller 120 may generate the sign control signal CTR11 having a low logic level and control the calculation circuit 140 to perform an operation of accumulating the output from the storage 130.

The storage 130 may include a shift register (e.g., the shift register 330 in FIG. 6). The shift register may store the magnitude A_K of the increment value of the pattern signal PAT per unit time, and output the magnitude signal MAG representing the magnitude A_K of the increment value of the pattern signal PAT per unit time. The controller 320 may generate a direction control signal (e.g., CTR21 of FIG. 6) to control a shift direction of the shift register. The shift register may output the magnitude signal MAG in a direction corresponding to the direction control signal CTR21, and the calculation circuit 340 may output the jitter code signal JIT by accumulating the magnitude signal MAG based on the first control signal CTR1. In addition, the controller may generate a shift control signal (e.g., CTR22 of FIG. 6) for determining a shift amount of the shift register.

Figure 9:
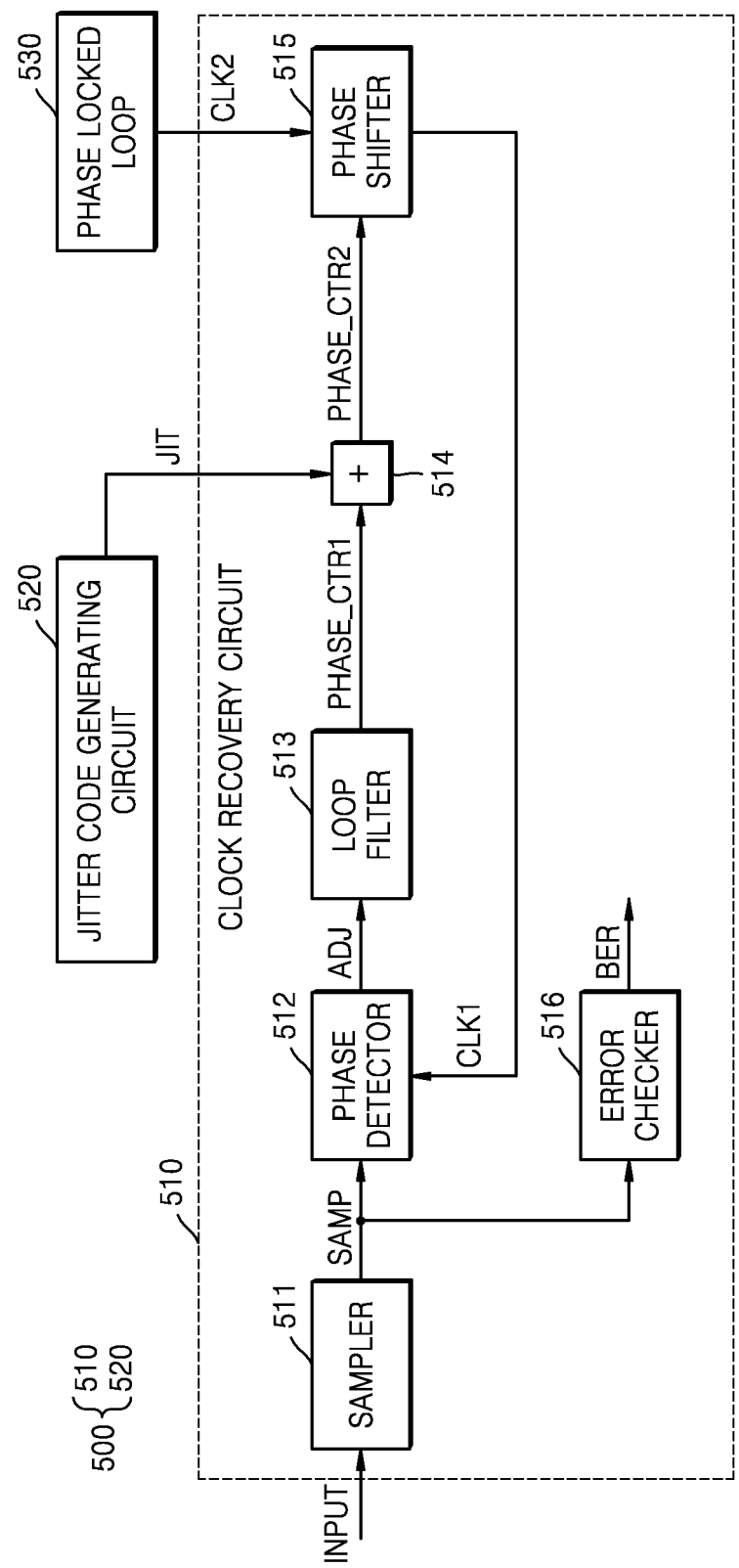
FIG. 9 is a diagram of a clock recovery apparatus according to an embodiment.

FIG. 9 is a diagram of a clock recovery apparatus 500 according to an embodiment. As shown in FIG. 9, the clock recovery apparatus 500 may include a clock recovery circuit 510 and a jitter code generating circuit 520.

The clock recovery circuit 510 may include a sampler 511, a phase detector 512, a loop filter 513, an adder 514, a phase shifter 515, and an error checker 516. Compared with the clock recovery circuit 410 of FIG. 8, the clock recovery circuit 510 of FIG. 9 may further include the error checker 516. The error checker 516 may receive a sampling signal SAMP from the sampler 511 and measure a bit error rate (BER), which is an error rate of all transmission bits, from the sampling signal SAMP. Accordingly, the clock recovery apparatus 500 may perform a jitter tolerance test by measuring the BER when a jitter code is included.

Figure 10:
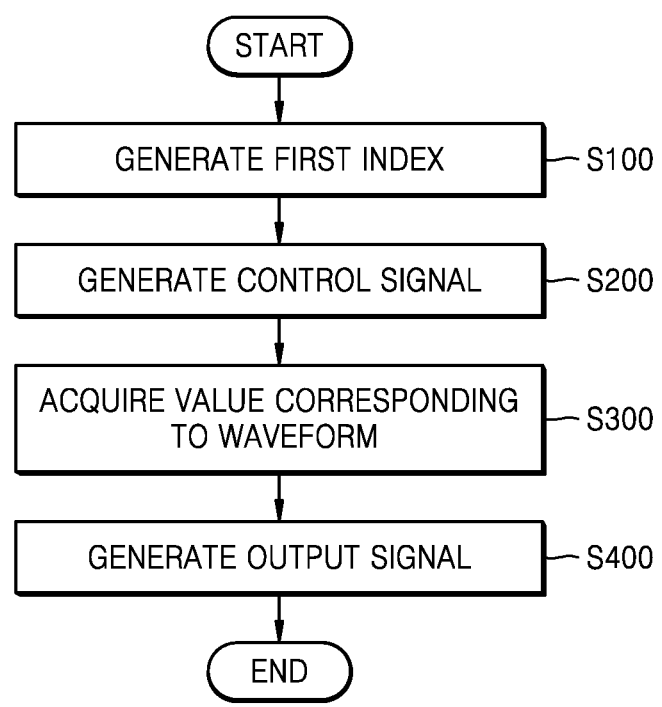
FIG. 10 is a flowchart illustrating a method of generating a pattern signal, according to an embodiment.

FIG. 10 is a flowchart illustrating a method of generating a pattern signal (or a pattern signal generating method) according to an embodiment. As shown in FIG. 10, the pattern signal generating method may include a plurality of operations S100 to S400.

In some embodiments, the pattern signal generating method of FIG. 10 may be performed by the pattern generating apparatus 100 of FIG. 1. In operation S100, a first index IDX1 may be generated to identify a time axis index of an output signal OUT having a waveform that is repeated every period. For example, the counter 110 may generate the first index IDX1, and the controller 120 may identify the time axis index of the output signal OUT based on the first index IDX1.

In operation S200, a control signal for controlling an operation for generating the output signal OUT may be generated. For example, the controller 120 may generate at least one control signal based on the first index IDX1 and a period of the output signal OUT. The control signal may be used to acquire a value stored in the storage 130 to generate the output signal OUT, and to calculate the acquired value in the calculation circuit 140.

In operation S300, a value corresponding to the waveform may be acquired. For example, the storage 130 may output a value corresponding to the waveform in a portion of a period based on the control signal generated in operation S200. Values corresponding to the remaining waveform of the period, that are not acquired, may be obtained by calculating values corresponding to a portion of the waveform acquired from the storage 130.

In operation S400, an output signal OUT may be generated. For example, the calculation circuit 140 may generate the output signal OUT by calculating a value acquired from the storage 130 based on the control signal generated in operation S200.

Figure 11:
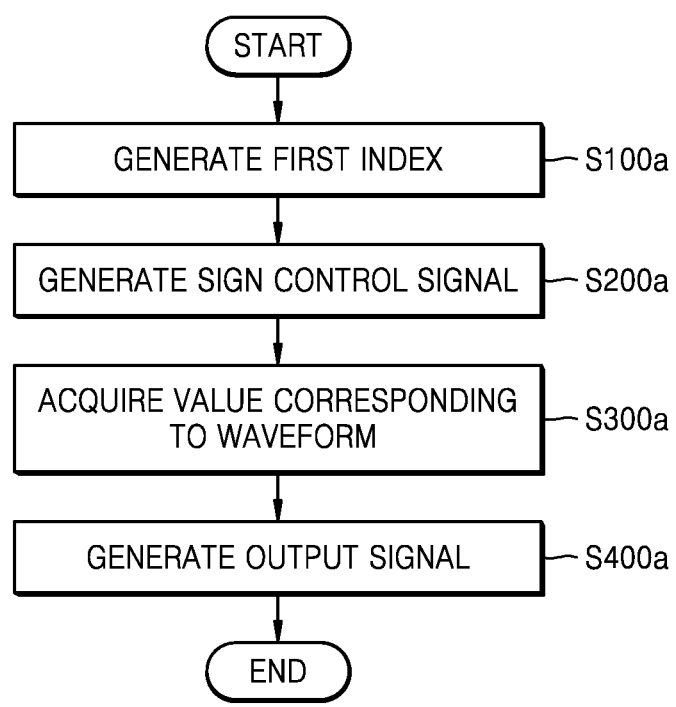
FIG. 11 is a flowchart illustrating a method of generating a pattern signal including a code control signal, according to an embodiment.

FIG. 11 is a flowchart illustrating a method of generating a pattern signal including a code control signal according to an embodiment.

In an embodiment, the flowchart of FIG. 11 illustrates a pattern signal generating method of controlling the sign of a value acquired from the storage 130 of FIG. 1 by generating a sign control signal as an example of FIG. 10. As shown in FIG. 11, the pattern signal generating method may include operations S100*a* to S400*a*. In some embodiments, the pattern signal generating method of FIG. 11 may be performed by the pattern generating apparatus 100 of FIG. 1. Hereinafter, FIG. 11 is described with reference to FIG. 1. The first control signal CTR1 of FIG. 1 may also be referred to as a sign control signal in FIG. 11.

In operation S100*a*, a first index IDX1 may be generated to identify a time axis index of the output signal OUT having a waveform that is repeated every period. For example, the counter 110 may generate the first index IDX1, and the controller 120 may identify the time axis index of the output signal OUT based on the first index IDX1.

In operation S200*a*, a sign control signal may be generated. In some embodiments, the controller 120 may determine the second index IDX2 corresponding to the period of the output signal OUT, and generate a sign control signal. For example, based on the first index IDX1 corresponding to the time axis coordinate of the output signal OUT and the second index IDX2 corresponding to the period of the output signal OUT, the controller 120 may identify the waveform of the output signal OUT. In order to generate the identified waveform, the controller 120 may generate a sign control signal CTR1 that determines a sign of a value acquired from the storage 130. Also, a second control signal CTR2 for controlling the output of the storage 130 may be generated in operation S200*a*.

In operation S300*a*, a value corresponding to the waveform may be acquired. For example, the storage 130 may output a value corresponding to the waveform in a portion of the period based on the second control signal CTR2 generated in operation S200*a*. Values corresponding to the remaining waveform of the period, that are not acquired, may be obtained by calculating values corresponding to a portion of the waveform acquired from the storage 130.

In operation S400*a*, an output signal OUT may be generated. For example, the code control signal CTR1 may be received by the calculation circuit 140 in operation S400*a*. For example, the calculation circuit 140 may receive the sign control signal CTR1 from the controller 120, and determine a sign of a value obtained from the storage 130 based on the sign control signal CTR1. The calculation circuit 140 may calculate a value corresponding to the identified sign. The output signal OUT may be generated based on a calculation result.

Figure 12:
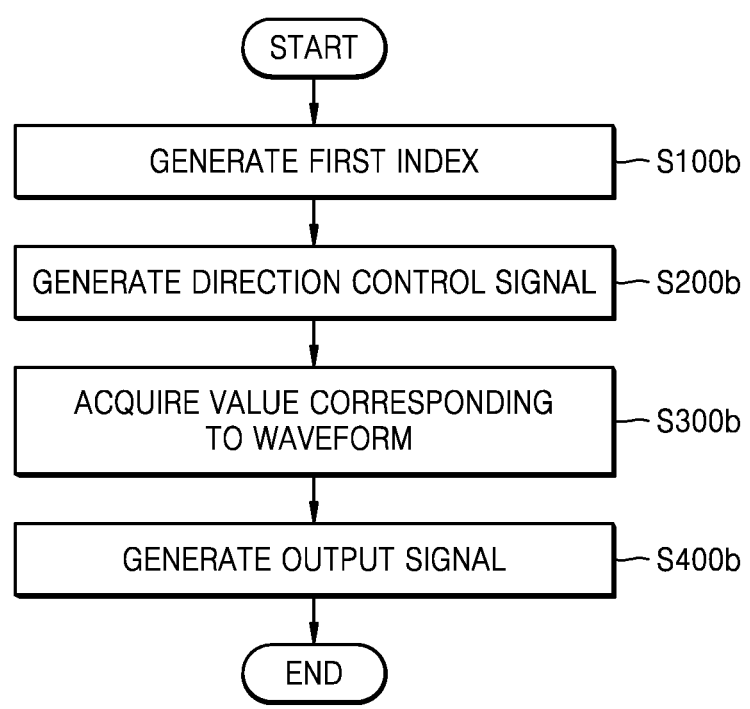
FIG. 12 is a flowchart illustrating a method of generating a pattern signal including a direction control signal, according to an embodiment.

FIG. 12 is a flowchart illustrating a method of generating a pattern signal including a direction control signal according to an embodiment.

In an embodiment, the flowchart of FIG. 12 illustrates a pattern signal generating method of controlling an output direction of the shift register 230 of FIG. 4 by generating a direction control signal as an example of FIG. 10. As shown in FIG. 12, the pattern signal generating method may include operations S100*b* to S400*b*. In some embodiments, the pattern signal generating method of FIG. 12 may be performed by the pattern generating apparatus 200 of FIG. 4. Hereinafter, FIG. 12 is described with reference to FIG. 4. The shift register 230 may store values corresponding to the magnitude A_K of the increment value per unit time in a portion of the period of the pattern signal PAT.

In operation S100*b*, a first index IDX1 may be generated to identify a time axis index of the output signal OUT having a waveform that is repeated every period. For example, the counter 210 may generate the first index IDX1, and the controller 220 may identify the time axis index of the output signal OUT based on the first index IDX1.

In operation S200*b*, a direction control signal may be generated. In some embodiments, the controller 220 may determine the second index IDX2 corresponding to the period of the output signal OUT, and may generate a direction control signal. For example, based on the first index IDX1 corresponding to a time axis coordinate of the output signal OUT and the second index IDX2 corresponding to the period of the output signal OUT, the controller 220 may identify the waveform of the output signal OUT. In order to generate the identified waveform, the controller 220 may generate a direction control signal CTR21 that determines a shift direction of the shift register 230.

In operation S300*b*, a value corresponding to the waveform may be acquired. For example, the shift register 230 may output values corresponding to the magnitude A_K of the increment value per unit time of the pattern signal PAT based on the direction control signal generated in operation S200*b*. Values corresponding to the magnitude A_K of the increment value per unit time remaining in the period, which are not acquired, may be obtained by calculating values corresponding to a portion of the waveform obtained from the shift register 230.

In operation S400*b*, an output signal OUT may be generated. For example, the calculation circuit 240 may generate the output signal OUT by calculating the value acquired from the shift register 230 based on the control signal generated in operation S200*b*.

Figure 13:
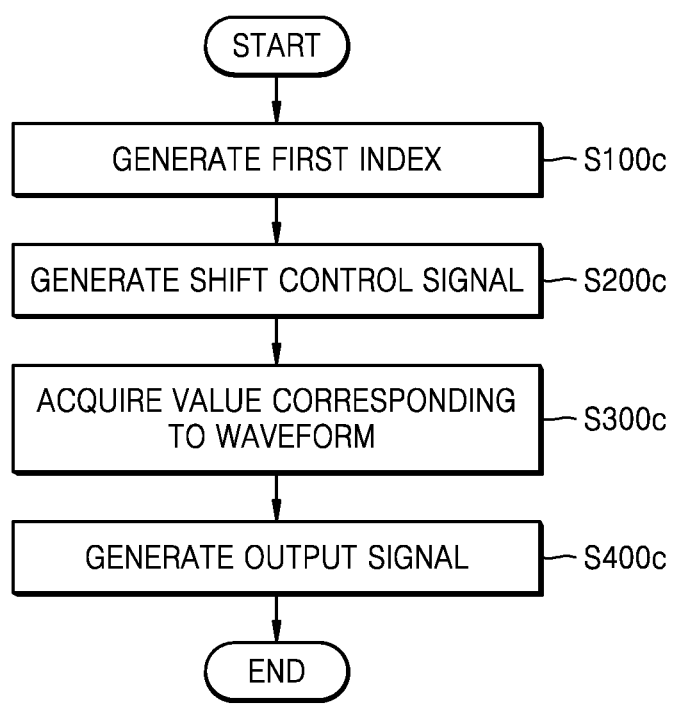
FIG. 13 is a flowchart illustrating a method of generating a pattern signal including a shift control signal, according to an embodiment.

FIG. 13 is a flowchart illustrating a method of generating a pattern signal including a shift control signal according to an embodiment.

In an embodiment, the flowchart of FIG. 13 represents a pattern signal generating method of controlling the shift amount of the output signal OUT of FIG. 4 by generating a shift control signal as an example of FIG. 10. As shown in FIG. 13, the pattern signal generating method may include operations S100c to S400c. In some embodiments, the pattern signal generating method of FIG. 13 may be performed by the pattern generating apparatus 200 of FIG. 4. Hereinafter, FIG. 13 is described with reference to FIG. 4.

In operation S100c, a first index IDX1 may be generated to identify a time axis index of the output signal OUT having a waveform that is repeated every period. For example, the counter 210 may generate the first index IDX1, and the controller 220 may identify the time axis index of the output signal OUT based on the first index IDX1.

In operation S200c, a shift control signal may be generated. In some embodiments, the controller 220 may determine the second index IDX2 corresponding to the period of the output signal OUT, and may generate a shift control signal. For example, based on the first index IDX1 corresponding to a time axis coordinate of the output signal OUT and the second index IDX2 corresponding to the period of the output signal OUT, the controller 220 may identify a waveform of the output signal OUT. In order to generate the identified waveform, the controller 220 may generate a shift control signal CTR22 that determines a shift amount of the shift register 230.

In operation S300c, a value corresponding to the waveform may be acquired. For example, the shift register 230 may output a value corresponding to the waveform in a portion of the period based on the shift control signal generated in operation S200c. Values corresponding to the remaining waveform of the period, that are not acquired, may be obtained by calculating values corresponding to a portion of the waveform acquired from the shift register 230.

In operation S400c, an output signal OUT may be generated. For example, the calculation circuit 240 may generate the output signal OUT by calculating the value acquired from the shift register 230 based on the control signal generated in operation S200c.

At least one of the components, elements, modules or units (collectively "components" in this paragraph) represented by a block in the drawings such as FIGS. 1, 2, 4, 6-9 may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the disclosed embodiments has been particularly shown and described with reference to examples thereof, it will be understood that various changes in form and details may be made therein without departing from the spirit and scope of the following claims.

What is claimed is:

1. An apparatus for generating an output signal having a waveform that is repeated every period, the apparatus comprising:
 a storage configured to store values corresponding to the waveform in a portion of a period of the output signal;
 a counter configured to generate a first index of a sample included in the output signal;
 a controller configured to generate at least one control signal based on the first index and the period of the output signal; and
 a calculation circuit configured to generate the output signal by calculating an output from the storage based on the at least one control signal.

2. The apparatus of claim 1, wherein the at least one control signal comprises a sign signal,
 wherein the calculation circuit is further configured to identify a sign of the output from the storage based on a sign control signal, and
 wherein the controller is further configured to:
   determine a second index corresponding to the period, and
   generate the sign control signal based on the first index and the second index.

3. The apparatus of claim 2, wherein the portion of the period may be a 90-degree phase of the period, and
 wherein the controller is further configured to change the sign control signal every 180-degree phase of the period.

4. The apparatus of claim 1, wherein the storage comprises a shift register, and wherein the controller is further configured to:
 determine a second index corresponding to the period, and
 control a shift direction of the shift register based on the first index and the second index.

5. The apparatus of claim 4, wherein the portion of the period is ¼ phase of the period, and
 wherein the controller is further configured to change the shift direction of the shift register every ¼ phase of the period.

6. The apparatus of claim 4, wherein the shift register is configured to store values corresponding to a magnitude of an increment value of the waveform per unit time in the portion of the period, and
 wherein the calculation circuit is further configured to accumulate the output from the storage based on the at least one control signal.

7. The apparatus of claim 6, wherein the shift register comprises a 1-bit shift register storing a value of 1 or a value of 0 corresponding to the magnitude of the increment value per unit time.

8. The apparatus of claim 4, wherein the controller is further configured to control a shift amount of the shift register based on the first index and the second index.

9. The apparatus of claim 1, wherein the at least one control signal comprises a gain signal, and
 wherein the calculation circuit is further configured to perform at least one of amplification and attenuation based on the gain signal.

10. The apparatus of claim 1, wherein the waveform comprises a sine wave.

11. An apparatus comprising:
a clock recovery circuit configured to, based on an input signal and a reference clock signal, generate an output clock signal synchronized with the input signal; and
a jitter code generating circuit configured to provide, to the clock recovery circuit, a jitter code signal having a waveform that is repeated every period,
wherein the jitter code generating circuit comprises:
   a storage configured to store values corresponding to the waveform in a portion of a period;
   a calculation circuit configured to generate the jitter code signal by calculating an output from the storage; and
   a controller configured to control the storage and the calculation circuit.

12. The apparatus of claim 11, wherein the clock recovery circuit comprises:
a sampler configured to sample the input signal;
a phase detector configured to detect a phase difference between an output from the sampler and a first clock signal;
a loop filter configured to generate a phase control signal from an output from the phase detector;
an adder configured to add an output from the loop filter to the jitter code signal; and
a phase shifter configured to generate the output clock signal based on an output from the adder and the reference clock signal.

13. The apparatus of claim 11, wherein the controller is further configured to generate a sign control signal, and
wherein the calculation circuit is further configured to identify a sign of the output from the storage based on the sign control signal.

14. The apparatus of claim 11, wherein the storage comprises a shift register, and
wherein the controller is configured to control a shift direction of the shift register.

15. The apparatus of claim 14, wherein the shift register is configured to store values corresponding to increments of the waveform per unit time in the portion of the period, and
wherein the controller is further configured to control the calculation circuit to accumulate the output from the storage.

16. A method of generating an output signal having a waveform that is repeated every period, the method comprising:
generating a first index of a sample included in the output signal;
generating at least one control signal based on the first index and a period of the output signal;
acquiring a value corresponding to the waveform in a portion of the period from a storage based on the at least one control signal; and
generating the output signal based on the acquired value.

17. The method of claim 16, wherein the generating of the at least one control signal comprises:
determining a second index corresponding to the period; and
generating a sign control signal to determine a sign of the acquired value based on the first index and the second index.

18. The method of claim 16, wherein the storage comprises a shift register, and wherein the generating of the at least one control signal comprises:
determining a second index corresponding to the period; and
generating a direction control signal for controlling a shift direction of the shift register, based on the first index and the second index.

19. The method of claim 18, wherein the shift register is configured to store values corresponding to magnitudes of increment values of the waveform per unit time in the portion of the period, and
wherein the generating of the output signal comprises accumulating an output from the shift register based on the at least one control signal.

20. The method of claim 18, wherein the generating of the at least one control signal comprises generating a shift control signal for controlling a shift amount of the shift register, based on the first index and the second index.

* * * * *